(12) United States Patent
Akita et al.

(10) Patent No.: US 6,438,059 B2
(45) Date of Patent: Aug. 20, 2002

(54) FUSE PROGRAMMING CIRCUIT FOR PROGRAMMING FUSES

(75) Inventors: Hironobu Akita, Kyoto; Kenji Tsuchida, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/874,208

(22) Filed: Jun. 6, 2001

(30) Foreign Application Priority Data

Jun. 9, 2000 (JP) ........................................ 2000-173718
May 10, 2001 (JP) ........................................ 2001-140279

(51) Int. Cl.[7] ................................................. G11C 7/00
(52) U.S. Cl. .................... 365/225.7; 365/177; 365/200; 327/525
(58) Field of Search ................................ 365/225.7, 96, 365/200, 177; 327/525, 526, 8

(56) References Cited

U.S. PATENT DOCUMENTS

| 4,605,872 | A | * | 8/1986 | Rung ........................... 327/525 |
|---|---|---|---|---|
| 4,786,958 | A | * | 11/1988 | Bhagat ......................... 327/565 |
| 4,861,731 | A | * | 8/1989 | Bhagat ......................... 257/140 |
| 5,003,371 | A |   | 3/1991 | Tailliet et al. |
| 5,319,592 | A | * | 6/1994 | Nguyen ......................... 365/96 |
| 5,552,338 | A |   | 9/1996 | Kang |
| 5,661,323 | A | * | 8/1997 | Choi et al. .................... 257/378 |
| 5,896,041 | A | * | 4/1999 | Sher et al. ..................... 326/38 |
| 6,128,241 | A | * | 10/2000 | Choi ......................... 365/225.7 |

FOREIGN PATENT DOCUMENTS

| JP | 1-158767 | 6/1989 |
|---|---|---|
| JP | 5-166934 | 7/1993 |

OTHER PUBLICATIONS

"Antifuse EPROM Circuit for Field Programmable DRAM", J.S. Choi et al., ISSCC Digest of Technical Papers, pp. 406–407, Feb. 2000.

* cited by examiner

*Primary Examiner*—Hoai V. Ho
*Assistant Examiner*—Gene N. Auduong
(74) *Attorney, Agent, or Firm*—Banner & Witcoff, Ltd.

(57) ABSTRACT

A fuse is programmed by being supplied with a current. The fuse is connected to a thyristor. A control circuit is connected to the gate of the thyristor. The control circuit turns the thyristor ON to allow the fuse to be programmed.

23 Claims, 7 Drawing Sheets

FUSE PROGRAMMING CIRCUIT FOR PROGRAMMING FUSES

CROSS-REFERENCE TO RELATED APPLICATIONS

This application is based upon and claims the benefit of priority from the prior Japanese Patent Applications No. 2000-173718, filed Jun. 9, 2000; and No. 2001-140279, filed May 10, 2001, the entire contents of both of which are incorporated herein by reference.

BACKGROUND OF THE INVENTION

The present invention relates to a fuse programming circuit applied to a redundancy circuit for, for example, a semiconductor memory device and adapted to program fuses and antifuses to store defective addresses.

The semiconductor memory devices have been made higher in integration density and larger in capacity size and it has, therefore, been difficult to manufacture semiconductor chips in a defect-free state. For this reason, a redundancy circuit has normally been provided in the semiconductor chip to remedy defects. The redundancy circuit has a plurality of spare cells, for example, in a word line unit or in a bit line unit. In the case where any defective cell is present in the portion of the semiconductor chip, it is saved by replacing the defective cell with a spare cell. It is, therefore, possible to improve the yield of semiconductor chips and wafers.

The redundancy circuit has a fuse for storing any defective address. Conventionally, as such a fuse, use has been made of a laser fuse programmed by a laser beam. In recent times, there has been a tendency toward using a current cut-off type fuse programmed by cutting off its current path by being supplied with a current as well as a current short-circuiting type antifuse programmed by short-circuiting its current path by being supplied with a current. In order to program the current cut-off type and current short-circuiting type fuses, it is necessary to flow a relatively large current of about 10 mA under a high voltage of about 10V. The programming of such a fuse is described, for example, in J. S. Choi, et al., "Antifuse EPROM Circuit for Field Programmable DRAM", ISSCC Digest of Technical Papers, pp. 406–407.

Further, the redundancy circuit has many fuses. A decoder and switch circuit adapted to be turned ON/OFF in accordance with an output signal of the decoder are so used as to select a fuse to be programmed from a plurality of fuses. Upon being supplied with a fuse address signal, the decoder produces an output signal for selecting one of a plurality of fuses in accordance with the fuse address signal. In this case, a corresponding switch circuit is turned ON, so that a high voltage/large current is supplied to a fuse connected to the switch circuit to allow the fuse to be programmed.

Incidentally, a high number of fuses have been used due to the tendency towards a higher capacity of the semiconductor memory device and a high number of switch circuits are used to select such fuses.

Further, in the conventional redundancy circuit, the switch circuit is comprised of a MOSFET and bipolar transistor. The MOSFET and bipolar transistor are made larger in size so as to control the high voltage/large current involved. In the case where many switch circuits are configured by the MOSFETs and bipolar transistors, a larger space is required to arrange such switch circuits. In the case where, in order to prevent an increase in chip area, the MOSFET and bipolar transistor in the switch circuit are made smaller in size than normal, it is difficult to flow a high voltage/large current for programming the fuse. It is, therefore, not possible to positively program the fuse involved. This causes a fall in yield.

BRIEF SUMMARY OF THE INVENTION

It is accordingly the object of the present invention to provide a fuse programming circuit which can prevent an increase in chip area and positively program fuses.

The object of the present invention is achieved by the following circuit.

That is, the fuse programming circuit comprises a fuse having first and second ends and programmed in accordance with a current supplied, the first end being connected to a first power supply; a thyristor having first and second electrodes and a gate electrode, the first electrode being connected to the second end of the fuse and the second electrode being connected to a second power supply lower in potential than the first power supply; and a control circuit having an input terminal supplied with an input signal and an output terminal connected to the gate electrode of the thyristor, the control circuit generating a control signal in accordance with the input signal which is supplied to the gate electrode of the thyristor to turn the thyristor ON.

The object of the present invention is achieved by the following circuit.

That is, the fuse programming circuit comprises a fuse having first and second ends and programmed in accordance with a current supplied, the first end being connected to a first power supply; a thyristor having first and second electrodes and gate electrode, the first electrode being connected to the second end of the fuse and the second electrode being connected to a second power supply lower in potential than the first power supply; and a control circuit having an input terminal supplied with an input signal and an output terminal connected to the gate electrode of the thyristor, the control circuit generating a control signal in accordance with the input signal which is supplied to the gate electrode of the thyristor to turn the thyristor ON.

Further, the object of the invention is achieved by the following circuit.

That is, the fuse programming circuit comprises a plurality of fuses having first and second ends and programmed in accordance with a current supplied, the first end of the respective fuse being connected to a first power supply; a plurality of thyristors having first and second electrodes and first and second gate electrodes, the first electrode of the respective thyristor being connected to the second end of the corresponding fuse and the second electrode being connected to a second power supply lower in potential than the first power supply; and a control circuit having an input terminal supplied with an input signal and a plurality of output terminals connected to the first and second gate electrodes of the respective thyristor, the control circuit generating a control signal for selecting one of these thyristors in accordance with the input signal.

The present invention can be applied to a fuse whose current path is cut off in accordance with a current supplied or an antifuse whose current path is short-circuited in accordance with a current supplied.

According to the present invention, the fuse is programmed with the use of a thyristor. This thyristor, though being smaller in size than the MOSFET and bipolar transistor, can control a high voltage/large current and, therefore, it can prevent the necessity to increase the chip area and is able to positively program fuses.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiments of the present invention will be described below with reference to the accompanying drawing.

(First Embodiment)

Figure 1:
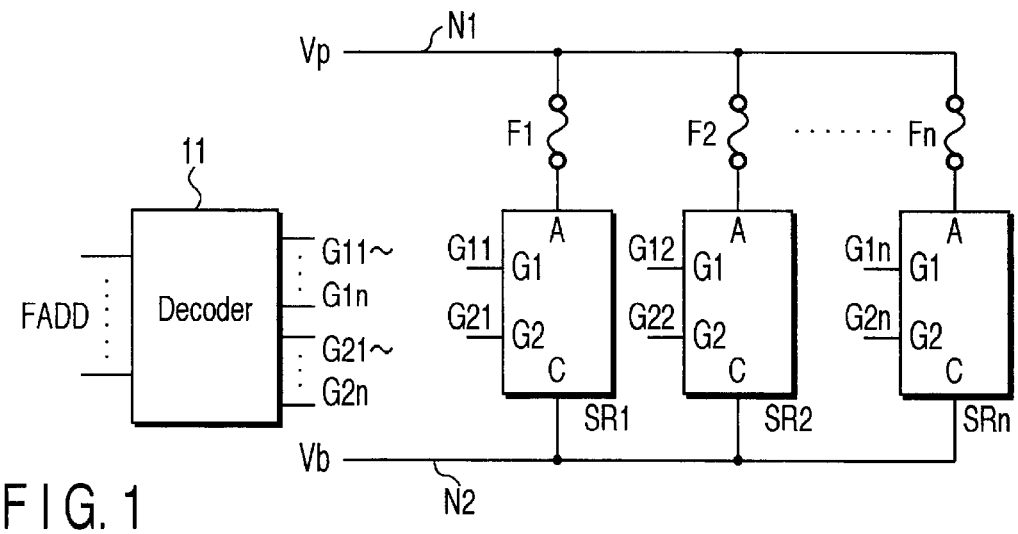
FIG. 1 is a circuit diagram showing a first embodiment of the present invention.

FIG. 1 shows a first embodiment of the present invention and shows a fuse selection circuit using thyristors as a switch circuit. For example, a high potential Vp is supplied to a first node N1 and current cut-off type fuses F1, F2, . . . , Fn are connected at their one end to the first node N1. These fuses F1, F2 and Fn are formed of, for example, polysilicon or metal. Those thyristors SR1, SR2, . . . , SRn, are connected respectively between their corresponding other ends of the fuses F1, F2, . . . , Fn and a second node N2 to provide the switch circuit. A potential Vb lower than the high potential Vp is supplied to the second node N2. The thyristors SR1, SR2, . . . , SRn, each, have an anode terminal A, cathode terminal C and gate terminals G1, G2. The anode terminal A of each of these thyristors is connected to the corresponding other end of the corresponding fuse and the cathode terminal C of the respective thyristor is connected to the second node N2.

For example, a fuse address signal FADD is supplied to the input terminal of a decoder 11. The decoder 11 generates control signals G11 to G1$n$, G21 to G2$n$ for selecting the thyristors SR1, SR2, . . . , SRn in accordance with a fuse address signal FADD. These control signals G11 to G1$n$ and G21 to G2$n$ are supplied to the corresponding gates G1, G2 of the respective thyristors. Of these thyristors SR1, SR2, . . . , SRn, one is selected by the control signals G11 to G1$n$ and G21 to G2$n$ from the decoder 11 and turned ON.

Figure 2:
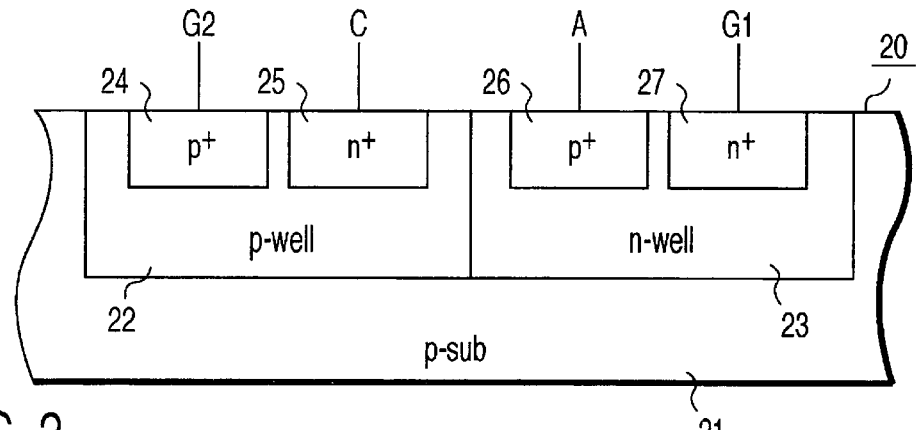
FIG. 2 is a cross-sectional view showing one practical form of a thyristor shown in FIG. 1.

FIG. 2 shows one practical form of the above-mentioned thyristor. This thyristor 20 is so formed as to have, for example, a twin well structure. That is, this structure has a p type well 22 and n type well 23 in a p type substrate 21. A p$^+$ diffusion layer 24 and n$^+$ diffusion layer 25 are formed in a surface portion of the p type well 22 and a p$^+$ diffusion layer 26 and n$^+$ diffusion layer 27 are formed in the surface portion of the n type well 23. The above-mentioned anode terminal A and gate terminal G1 are connected to the p$^+$ diffusion layer 26 and n$^+$ diffusion layer 27, respectively. And the above-mentioned gate terminal G2 and cathode terminal C are connected to the p$^+$ diffusion layer 24 and n$^+$ diffusion layer 25, respectively.

As set out above, the thyristor 20 of the twin well structure can be formed by an ordinary CMOS process. It is, therefore, not necessary to change the manufacturing process of a semiconductor memory device. In order to prevent any adverse effect, such as a latch-up, from occurring at an area other than the fuse selection circuit through the injection of a minority carrier in the p type well 22 into the substrate, it is only necessary to adopt a triple well structure.

Figure 3:
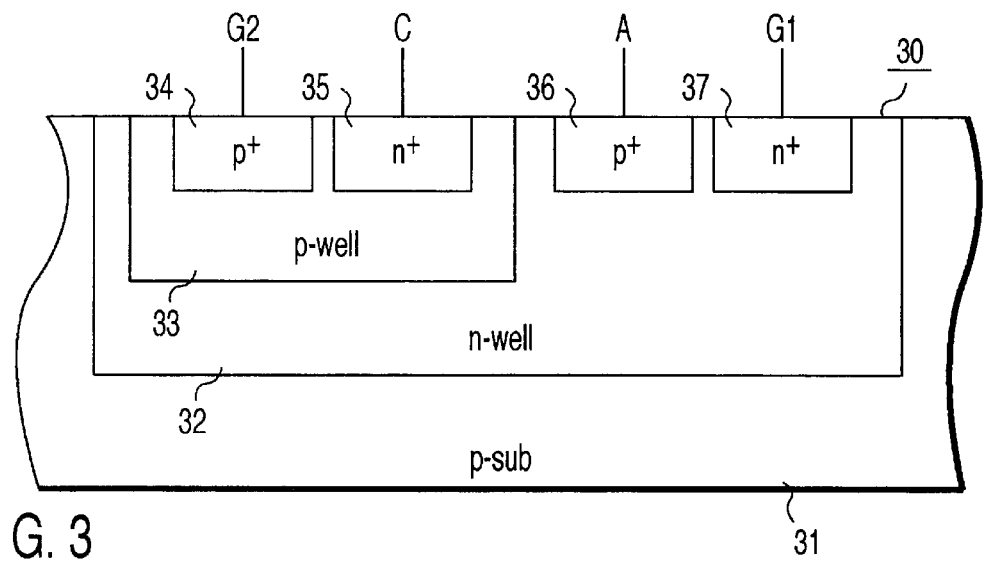
FIG. 3 is a cross-sectional view showing another practical form of a thyristor shown in FIG. 1.

FIG. 3 shows a practical form of a thyristor of a triple well structure. In this thyristor 30, an n type well 32 is formed in a p type substrate 31 and a p type well 33 is formed in the n type well 32. A p$^+$ diffusion layer 34 and n$^+$ diffusion layer 35 are formed in a surface portion of the p type well 33 and a p$^+$ diffusion layer 36 and n$^+$ diffusion layer 37 are formed in the surface portion of the n type well 32.

The above-mentioned anode terminal A and gate terminal G1 are connected to the p$^+$ diffusion layer 36 and n$^+$ diffusion layer 37, respectively, and the above-mentioned gate terminal G2 and cathode terminal C are connected to the p$^+$ diffusion layer 34 and n$^+$ diffusion layer 35, respectively.

By forming such p type well 33 in the n type well 32 it is possible to prevent the diffusion of the minority carrier of the p type well 33 into the substrate 31 and, thus, to prevent the occurrence of latch-up at an area other than the fuse selection circuit.

Figure 4:
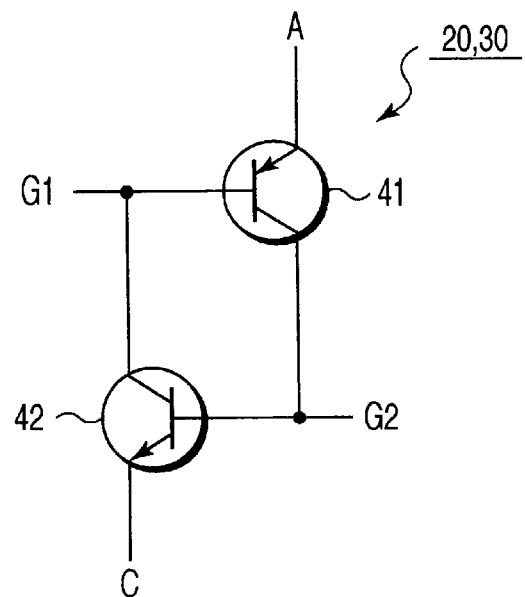
FIG. 4 is an equivalent circuit diagram showing the thyristor shown in FIGS. 2 and 3.

FIG. 4 shows an equivalent circuit of the thyristors 20 and 30 shown in FIGS. 2 and 3, the same reference numerals being employed to designate parts or elements corresponding to those shown in FIGS. 1 to 3. The thyristors 20, 30 provide a positive feedback circuit comprised of a pnp transistor 41 and npn transistor 42. The thyristors 20, 30 are such that, in an Off state, a resistive value between the anode terminal A and the cathode terminal C is very great. For this reason, no current flows between the anode terminal A and the cathode terminal C. When a charge is injected from the gate terminals G1, G2, the thyristor is turned ON, thus flowing a current between the anode terminal A and the cathode terminal C.

Figure 5:
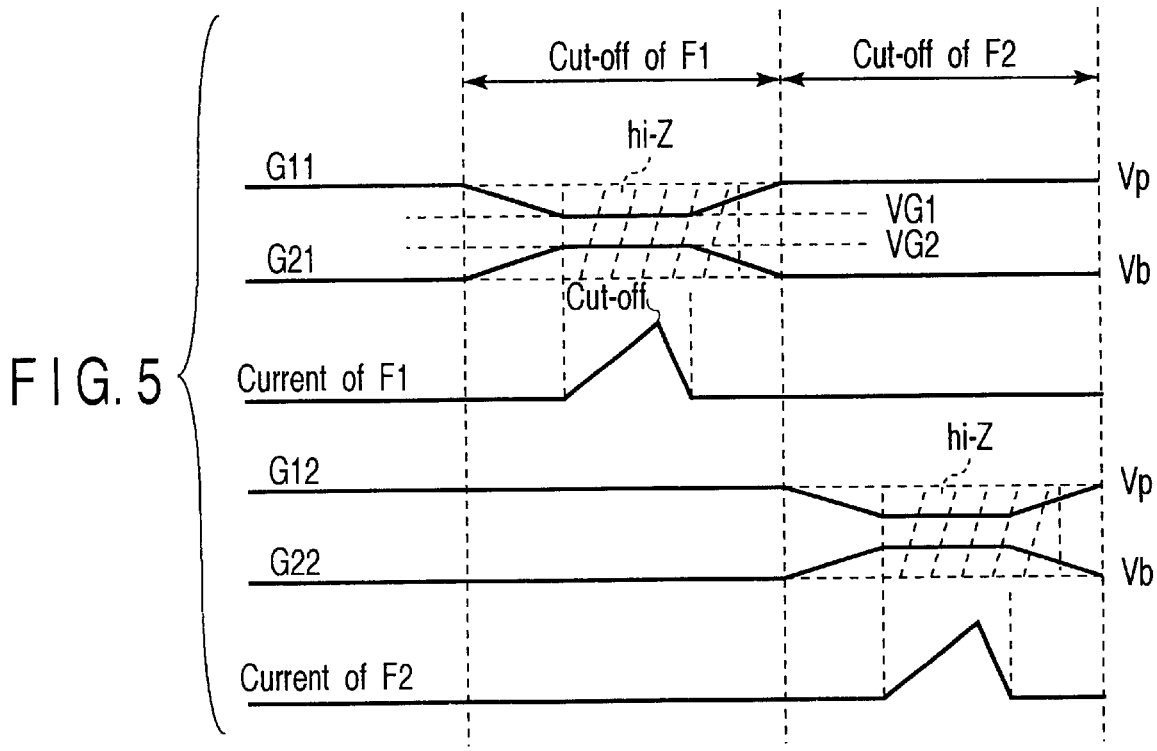
FIG. 5 is a timing chart showing the operation of the circuit shown in FIG. 1.

The operation of the circuit shown in FIG. 1 will be explained below with reference to FIG. 5. In the case where, for example, the fuse F1 is to be cut off, the decoder 11 turns the thyristor SR1 ON in accordance with the fuse address signal FADD. That is, in this case, the control signals G11, G21 are outputted from the decoder 11. The control signal G11 is set to a potential Vp, for example, at an unselected time and to a potential VG1 at a selected time. This potential VG1 is lower by, for example, about 1V than the potential Vp so as to allow the minority carrier to be fully injected between the base and the emitter of the pnp transistor. The control signal G21 is set to a potential Vb at an unselected time and to a potential VG2 at a selected time. The potential VG2 is higher by, for example, about 1V than the potential Vb so as to allow the minority carrier to be fully injected between the base and the emitter of the npn transistor.

When the thyristor SR1 is turned ON in accordance with the control signals G11, G21, then a high voltage/large current is supplied to the fuse F1 through the thyristor SR1 to cut off the fuse F1. When the fuse F1 is cut off, the current path of the thyristor SR1 is opened, thus returning the thyristor SR1 back to an OFF state automatically. In the case where the fuse F2 is programmed, the same operation as that of the thyristor SR1 is performed on the thyristor SR2.

After the above-mentioned thyristor SRi is turned ON, it is not necessary for the decoder 11 to control the thyristor SR1. Rather it is preferable that the output end of the decoder 11 be put to a high impedance (hi-Z) state so as not to allow a DC current to flow between the decoder 11 and the thyristor SR1. By doing so, it is possible to supply a full current to the thyristor. The hatched areas shown in FIG. 5 show the periods in which the decoder 11 is put in the high impedance state. After this, the control signals G11 and G21 are returned back to the potentials Vp and Vb, respectively.

In order to put the output end of the decoder 11 in the high impedance state it is only necessary that a tri-state buffer be provided to the output end of the decoder 11.

Figure 6A:
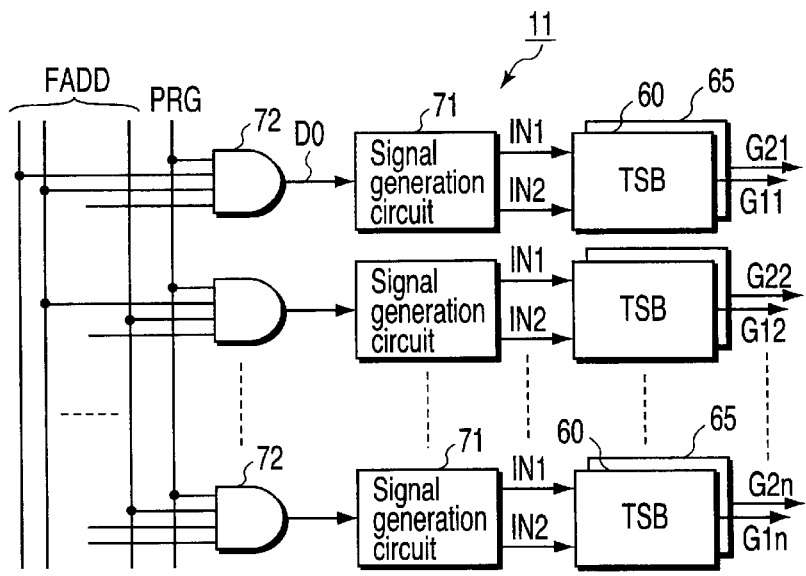
FIG. 6A is a view showing the practical form of a decoder.

FIG. 6A shows one practical form of the decoder 11. This decoder 11 has an n number of AND circuits 72 in a decode section. Of the fuse address signals FADD, a bit signal and fuse program signal PRG which select a corresponding fuse are supplied to the input terminals of the AND circuits 72. The output terminal of the respective AND circuit is connected to the input terminal of a corresponding signal generation circuit 71. The respective signal generation circuit 71 generates signals IN1 and IN2 in accordance with the output signal of the AND circuit 72. Tri-state buffers (TSB) 60, 65 are connected to the output terminals of the respective signal generation circuit 71. The tri-state buffers 60 output control signals G11 to G1n in accordance with signals IN1 and IN2. The tri-state buffers 65 output control signals G21 to G2n in accordance with the signals IN1, IN2 supplied from the signal generation circuit 71.

The signal generation circuit 71 and tri-state buffers 60, 65 corresponding to the control signals G11, G21 and signal generation circuits 71 and tri-state buffers 60, 65 corresponding to the control signals G12, G22 to G1n, G2n have the same structure. For this reason, the actual layout of the signal generation circuit 71 and tri-state buffers 60, 65 corresponding to the control signals G11, G21 will be explained below.

Figure 6B:
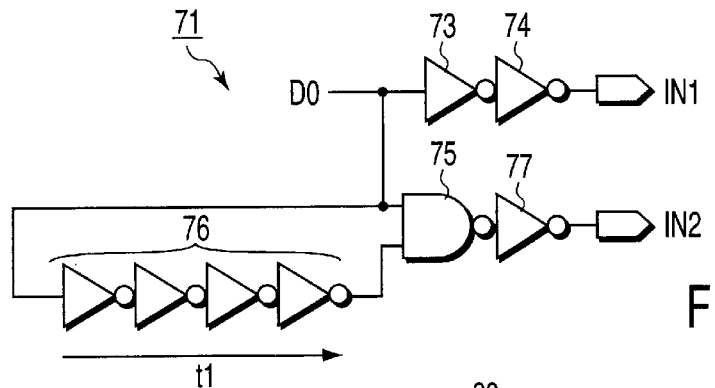
FIG. 6B is a circuit diagram showing one practical form of a signal generation circuit shown in FIG. 6A and FIGS. 6C and 6D, each, are one form of a tri-state buffer shown in FIG. 6A.

FIG. 6B shows one practical form of the signal generation circuit 71. In this signal generation circuit 71, a decode output signal D0 supplied from the AND circuit 72 is supplied to the input terminal of an inverter circuit 73. An inverter circuit 74 is connected in series with the output of the inverter circuit 73. The above-mentioned signal IN1 is outputted from the output terminal of the inverter circuit 74. Further, the above-mentioned decode output signal D0 is supplied to one input terminal of a NAND circuit 75 and to an input terminal of a delay circuit 76. This delay circuit 76 is comprised of, for example, four series-connected inverter circuits and has a delay time t1. The output terminal of the delay circuit 76 is connected to the other input terminal of the NAND circuit 75. The output terminal of this NAND circuit 75 is connected to the input terminal of an inverter circuit 77 and the above-mentioned signal IN2 is outputted from the output terminal of the inverter circuit 77.

Figure 6C:
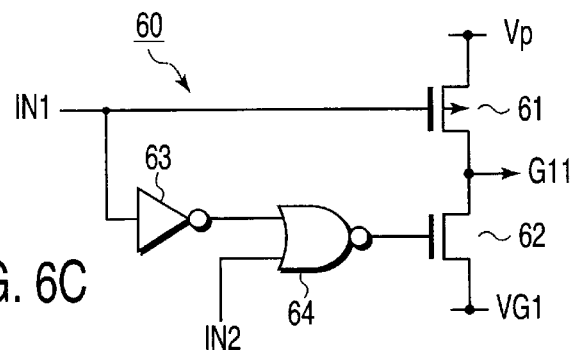

FIG. 6C shows one practical form of a tri-state buffer 60. A series circuit of a p channel MOS transistor 61 and an n channel MOS transistor 62 is connected between those nodes supplied with the above-mentioned potential Vp and potential VG1. And, the above-mentioned control signal G11 is outputted from a connection node between these MOS transistors 61 and 62. A signal IN1 from the signal generation circuit 71 is supplied to the gate of the MOS transistor 61 and to one input terminal of a NOR circuit 64 through an inverter circuit 63. A signal IN2 from the signal generation circuit 71 is supplied to the other input terminal of the NOR circuit 64. The output terminal of the NOR circuit 64 is connected to the gate of the transistor 62.

Figure 6D:
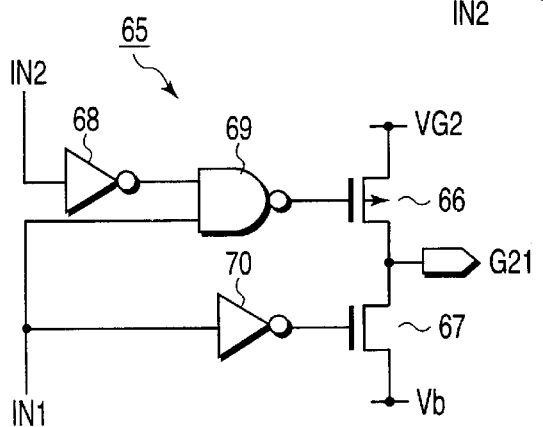

FIG. 6D is one practical form of the abovementioned tri-state buffer 65. In the tri-state buffer 65, a series circuit of a p channel MOS transistor 66 and n channel MOS transistor 67 is connected between the above-mentioned potential VG2 and a node to which a potential Vb is supplied. The above-mentioned control signal G21 is outputted from a connection node between these transistors 66 and 67. The signal IN2 from the signal generation circuit 71 is supplied through an inverter circuit 68 to one input terminal of a NAND circuit 69. A signal IN1 from the signal generation circuit 71 is supplied to the other input terminal of the NAND circuit 69. The output terminal of the NAND circuit 69 is connected to the gate of the transistor 66. Further, the above-mentioned signal IN1 is supplied through an inverter circuit 70 to the gate of the transistor 67.

Figure 7:
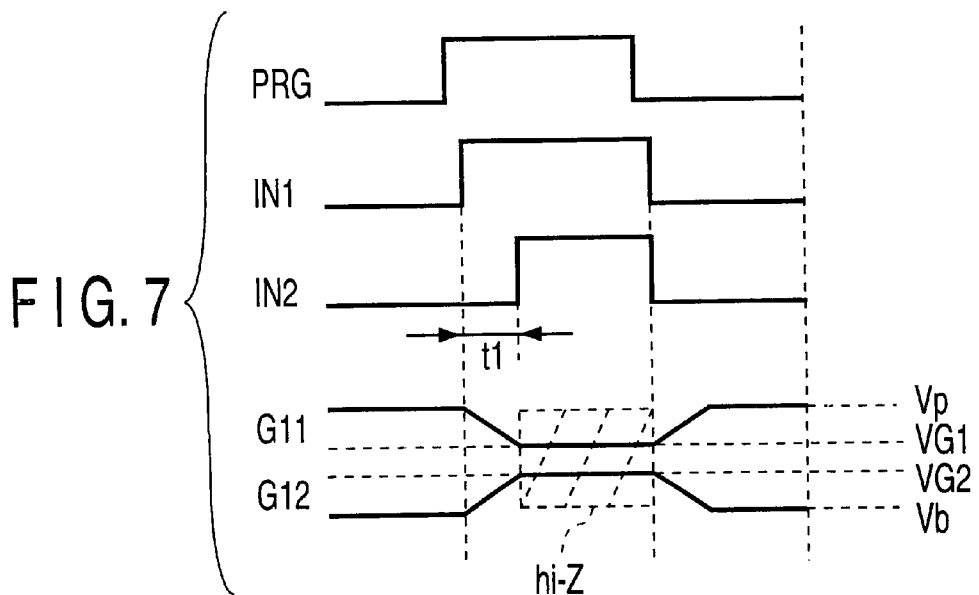
FIG. 7 is a timing chart showing the operation of the tri-state buffer shown in FIG. 6A.

FIG. 7 is a timing chart showing the operations of the above-mentioned signal generation circuit 71 and tri-state buffers 60, 65. At a non-programming time of the fuse, a fuse programming signal PRG is set to a low level. Thus, the output signal of the AND circuit 72 shown in FIG. 6A is set to a low level and the output signal IN1, IN2 of the signal generation circuit 71 are set both to low levels. In the tri-state buffer 60, therefore, the transistor 61 is turned ON and the transistor 62 is turned OFF, so that the control signal G11 is set to the potential Vp. In the tri-state buffer 65, the transistor 67 is turned ON and the transistor 66 is turned OFF, so that the control signal G21 is set to the potential Vb.

When, in this state, the fuse program signal PRG is set to a high level and a bit signal corresponding to the fuse address signal FADD for selecting a fuse F1 is set to a high level, then the decoder output signal D0 of the AND circuit 72 shown in FIG. 6A is set to a high level. In this state, the signal IN1 outputted from the inverter circuit 74 in the signal generation circuit 71 is set to a high level. Then, in the tri-state buffer 60, the transistor 61 is turned OFF and the transistor 62 is turned ON. Therefore, the output signal G11 of the tri-state buffer 60 is set to a potential VG1 lower than the potential Vp by about 1V. In the tri-state buffer 65, the transistor 67 is turned OFF and transistor 66 is turned ON.

For this reason, the output signal G21 of the tri-state buffer 65 is raised to the potential VG2 higher than the potential Vb by about 1V.

If, after this, a delay time t1 elapses in the delay circuit 76 of the signal generation circuit 71, then the level of the output signal of the delay circuit 76 becomes high. For this reason, the level of the output terminal of the NAND circuit 75 becomes low level and the level of the output signal of the inverter circuit 77 becomes high. Then, the level of the output signal of the NOR circuit 64 in the tri-state buffer 60 becomes low and the transistor 62 is turned OFF. Thus, the connection node between the transistor 61 and the transistor 62 is put in a high impedance state. And, the level of the output signal of the NAND circuit 69 in the tri-state buffer 65 becomes high in accordance with the high level signal IN2. Therefore, the transistor 66 is turned OFF and the connection node between the transistors 66 and 67 is put in a high impedance state.

In this way, the output end of the decoder 11 corresponding to the thyristor for which a given fuse has been programmed is put in a high impedance state. Thus it is possible to prevent current from flowing between the thyristor and the decoder 11.

According to the first embodiment, it is possible to program a desired fuse by using the thyristor as a switch circuit. In comparison with the case where, as in the prior art, use is made of MOSFETs and bipolar transistors, the thyristor has an advantage in that, with a small size, it can flow a high voltage/large current through the fuse.

In the case where the fuse is programmed with the thyristor ON, the output end of the decoder 11 is put in to a high impedance state. For this reason, it is possible to prevent a DC current flow between the decoder 11 and the thyristor, and hence to supply a full current to the fuse. As a result, it is possible to positively program the fuse.

(Second Embodiment)

Figure 8:
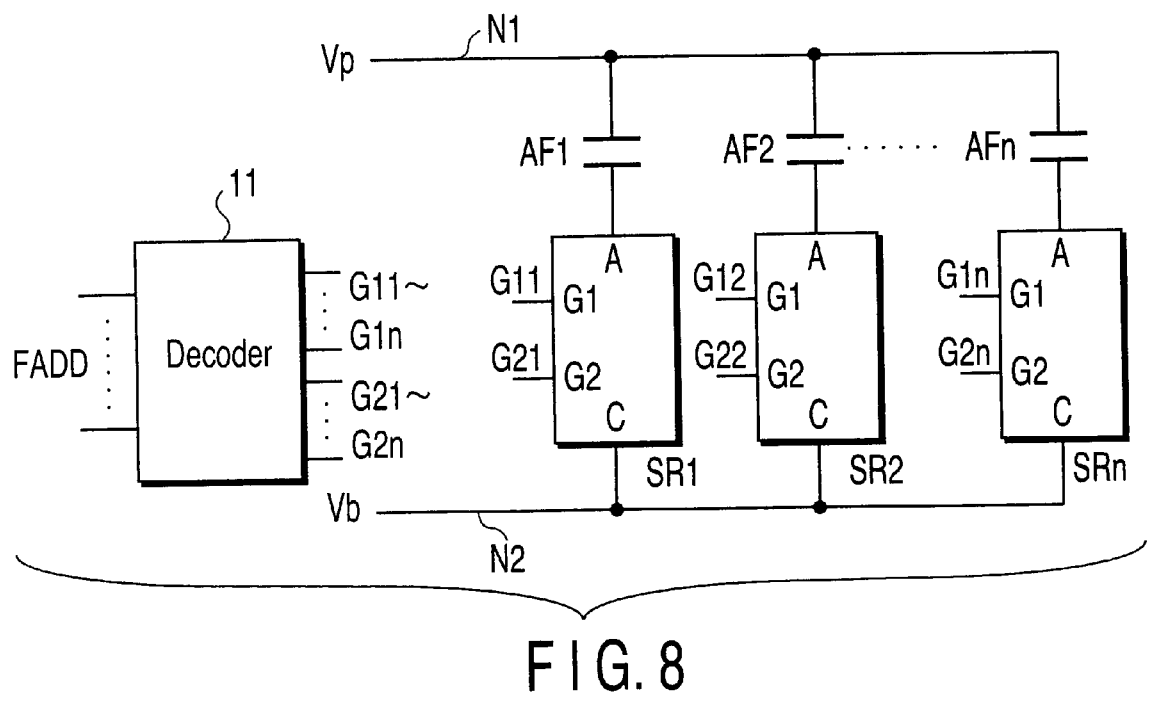
FIG. 8 is a circuit diagram showing a second embodiment of the present invention.

FIG. 8 shows a second embodiment of the present invention with the same reference numerals employed to designate parts or elements corresponding to those shown in FIG. 1 and an explanation made only about those different portions. In this second embodiment, an antifuse is used as a current short-circuiting type fuse. That is, antifuses AF1, AF2, ..., AFn, each, are connected between a first node N1 supplied with a potential Vp and an anode terminal A of a corresponding one of thyristors SR1, SR2, ..., SRn. The antifuses AF1, AF2, ..., AFn, have substantially the same structure as that of a storage capacitor, for example, in a DRAM and are manufactured by the same process as that of the storage capacitor. The antifuse, being programmed, allows a continued flow of current. It is, therefore, necessary, unlike the current cut-off type fuse, to make control under which the thyristor is turned OFF. For this reason, a buffer is needed to draw off a minority carrier and, as this buffer, for example, a tri-state buffer is preferable.

Figure 9:
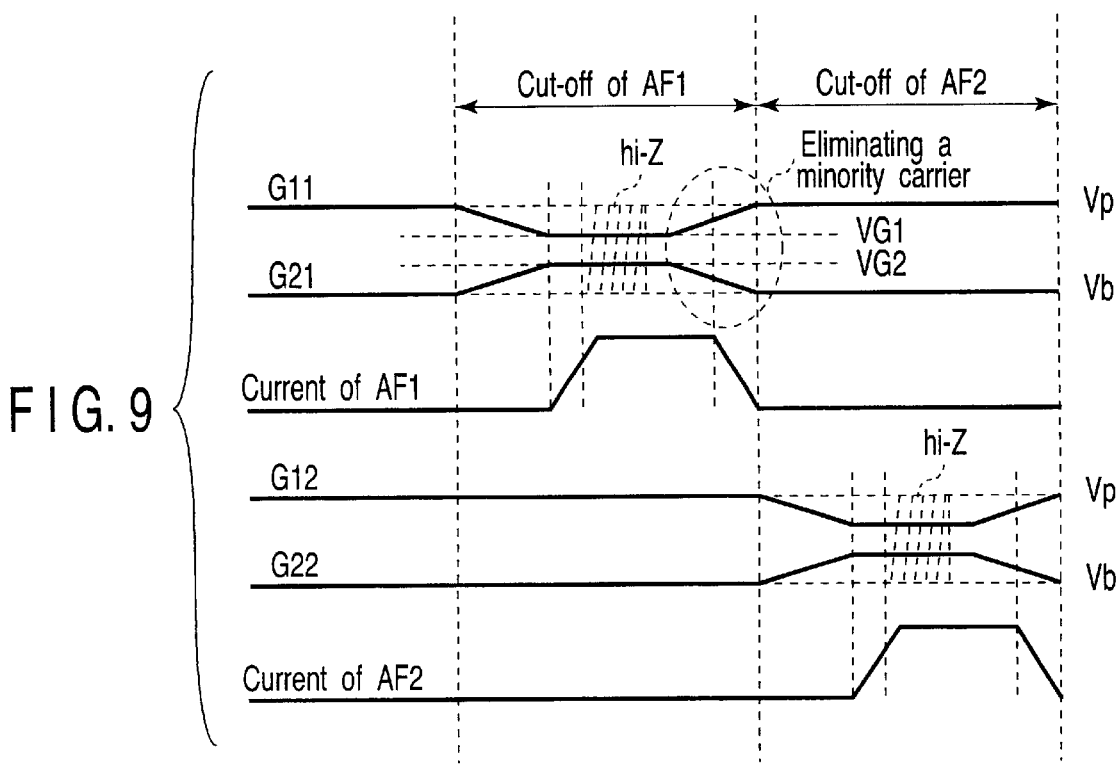
FIG. 9 is a timing chart showing the operation of the embodiment shown in FIG. 8.

FIG. 9 is a timing chart showing the operation of the circuit of FIG. 8. In the case where the antifuse AF1 for example is to be cut off, a decoder 11 turns the thyristor SR1 ON in accordance with the fuse address signal FADD. That is, in this case, control signals G11, G21 are outputted from the decoder 11. For example, the control signal G11 is set to a potential Vp at an unselected time and to a potential VG1 at a selected time which is lower than the potential Vp by, for example, about 1V. Further, the control signal G21 is set to a potential Vb at an unselected time and to a potential VG2 at a selected time which is higher than the potential Vb by, for example, about 1V.

When the thyristor SR1 is turned ON in accordance with control signals G11, G21, a high voltage/large current is supplied to the antifuse AF1 through the thyristor SR1 and the antifuse AF1 is programmed. When the antifuse AF1 is programmed and the current path is short-circuited, then a continuous current flows through the thyristor SR1. For this reason, the thyristor SRi is rendered OFF by the control signals G11, G21 from the decoder 11. That is, with the control signal G11 from the decoder 11 represented by the potential Vp and the control signal G21 from the decoder 11 represented by the potential Vb, a minority carrier of the thyristor SR1 is eliminated from the gates G1, G2 and the thyristor SR1 is turned OFF.

According to the second embodiment of the present invention, the same advantage as that of the first embodiment can be obtained with the use of the antifuse.

(Third Embodiment)

Figure 10:
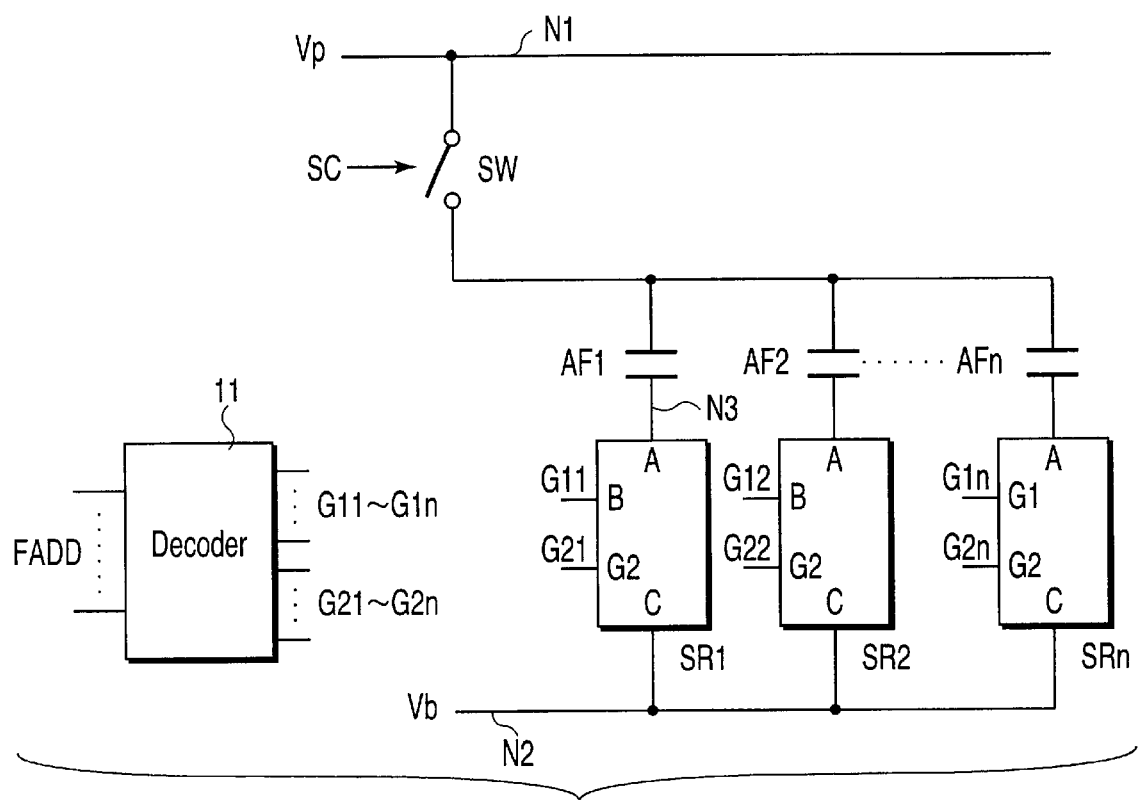
FIG. 10 is a circuit diagram showing a third embodiment of the present invention.

FIG. 10 shows a third embodiment of the present invention with the same reference numerals employed to designate parts or elements corresponding to those shown in FIG. 8 and an explanation is only given regarding the portions which are different.

In connection with the second embodiment, the case of eliminating the minority carrier of the thyristor from the gate so as to turn the thyristor OFF has been explained above. In this case, however, in order to draw out the minority carrier, a buffer 60 is necessary. Therefore, the size of the resultant decoder 11 is increased. In the third embodiment, on the other hand, instead of turning the thyristor OFF by the decoder 11, the thyristor is turned OFF with the use of a switch different from the decoder 11.

That is, in FIG. 10, a switch SW is connected between one end side of antifuses AF1, AF2, ..., AFn, and a first node N1 to which a potential Vp is supplied. This switch SW is comprised of, for example, one MOS transistor and controlled by a signal SC. This signal SC may be generated using, for example, a timer circuit not shown or supplied from an outside of the semiconductor memory device.

Figure 11:
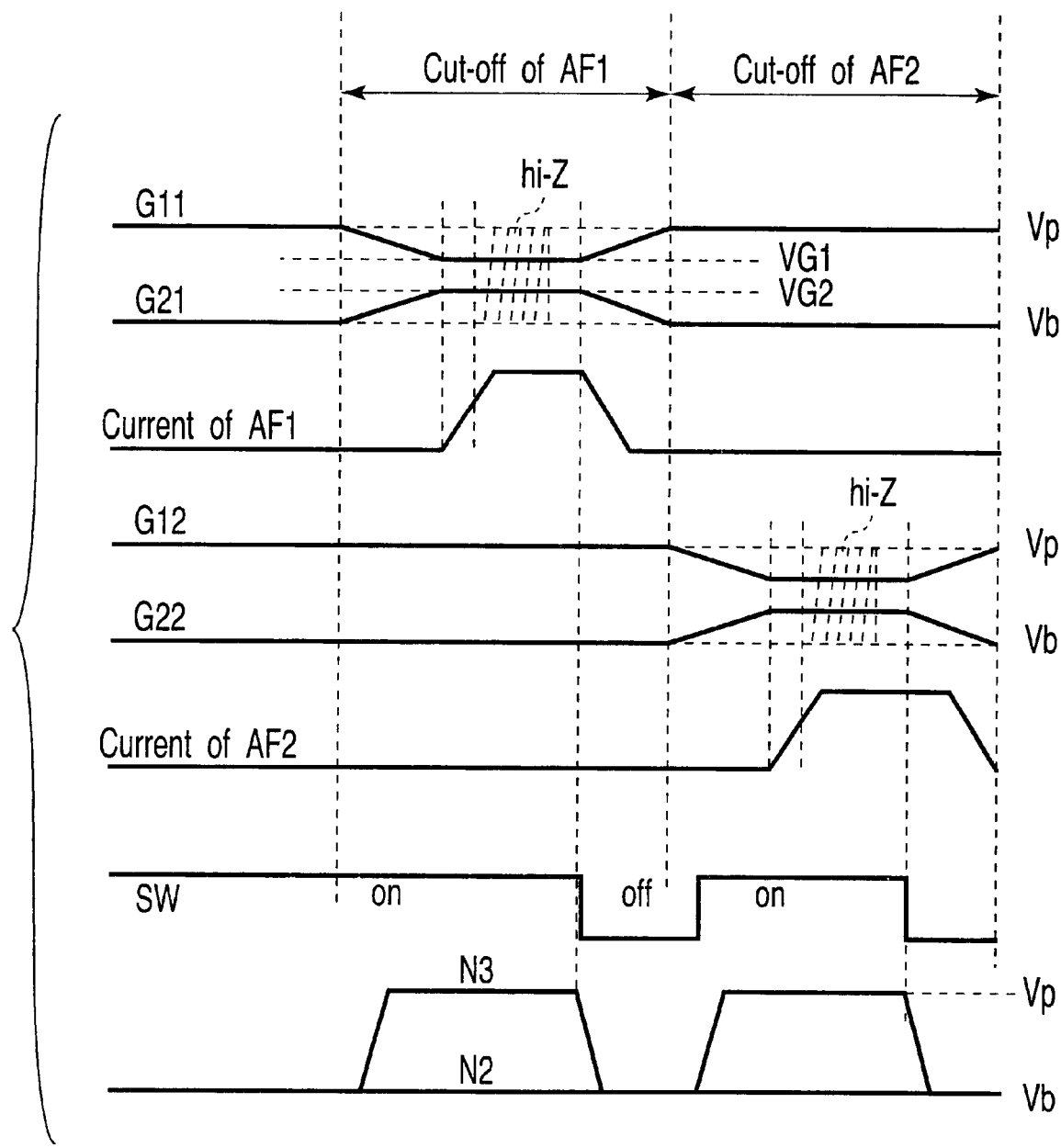
FIG. 11 is a timing chart showing the operation of the embodiment shown in FIG. 10.

FIG. 11 is a timing chart showing an operation of the circuit of FIG. 10. In FIG. 11, the thyristor is turned ON in the same way as in FIG. 9. In this case, the switch SW is turned ON. This turns, for example, the thyristor SR1 ON and the output end of the decoder 11 is put in a high impedance state, so that the antifuse AF1 is programmed. After this, the switch SW is turned OFF at a fully programmed timing.

For this reason, a power supply to the thyristor SR1 is blocked, thus turning the thyristor SR1 OFF. By providing the switch SW, the decoder 11 need not draw out the minority carrier of the thyristor from the gate.

According to the third embodiment, the switch SW is provided between the first power supply node N1 and the antifuses AF1, AF2, ..., AFn and, after the AF1, AF2, ..., AFn, have been programmed, turned OFF, so that the thyristor is turned OFF. For this reason, the decoder 11 need not draw out the minority carrier of the thyristor from the gate. Thus, without enlarging the size of the transistors (transistors 61, 62 in FIG. 6C) in a tri-state buffer in the decoder 11, it is possible to positively turn the thyristor OFF.

Further it is only necessary to provide one switch SW for a plurality of fuses and it is possible to prevent the chip size from being enlarged.

(Fourth Embodiment)

Figure 12:
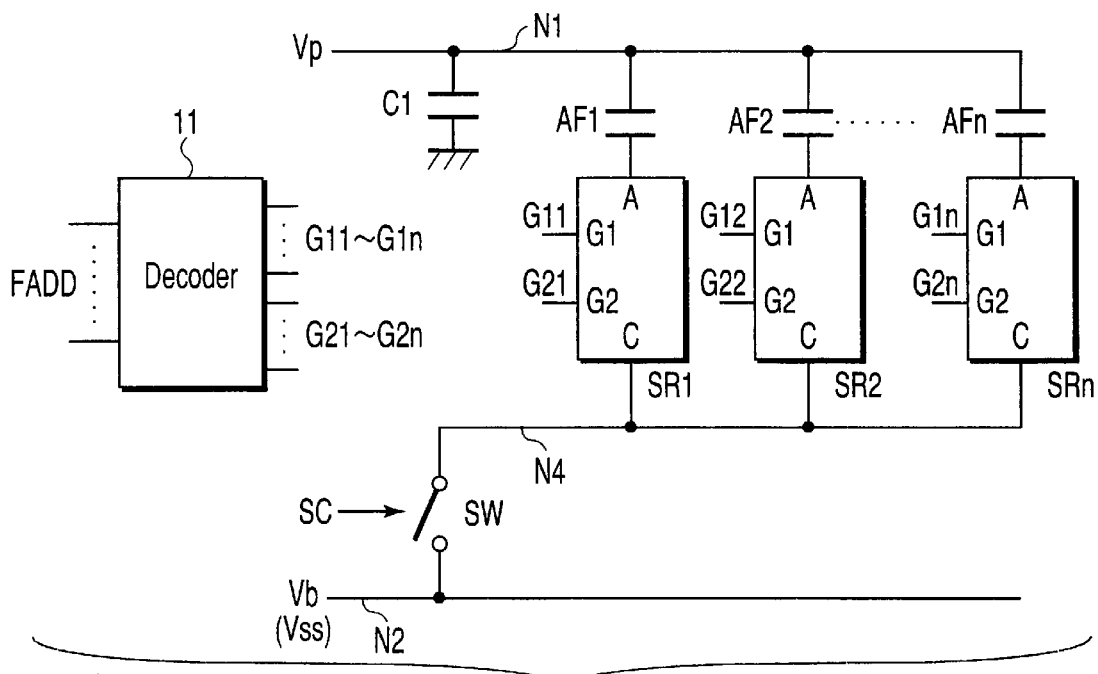
FIG. 12 is a circuit diagram showing a fourth embodiment of the present invention.

FIG. 12 shows a fourth embodiment of the present invention with the same reference numerals employed to designate parts or elements corresponding to those in FIG. 8 and an explanation made about different portions only.

In the third embodiment, the switch SW has been provided between the thyristors and the first power supply node N1 supplied with a high potential Vp and the thyristor is turned OFF by being disconnected from the first power supply node N1. Therefore, a potential on the first node N1 varies greatly by turning the switch SW ON or OFF. Normally, the high potential Vp for programming the fuses is generated by boosting a power supply voltage by a pump circuit provided in a semiconductor memory device. Further, as a low potential Vb use is often made of a ground potential Vss. In order to stabilize the operation of the pump circuit, it is desirable that the high potential Vp be suppressed from being charged or discharged to ensure a stable operation.

In the fourth embodiment, as shown in FIG. 12, a switch SW is connected between a cathode terminal C side of thyristors SR1, SR2, . . . , SRn and a second node N2 supplied with a low potential Vb. Further, between a first node N1 and ground, a capacitor C1 is connected to stabilize a first node N1.

Figure 13:
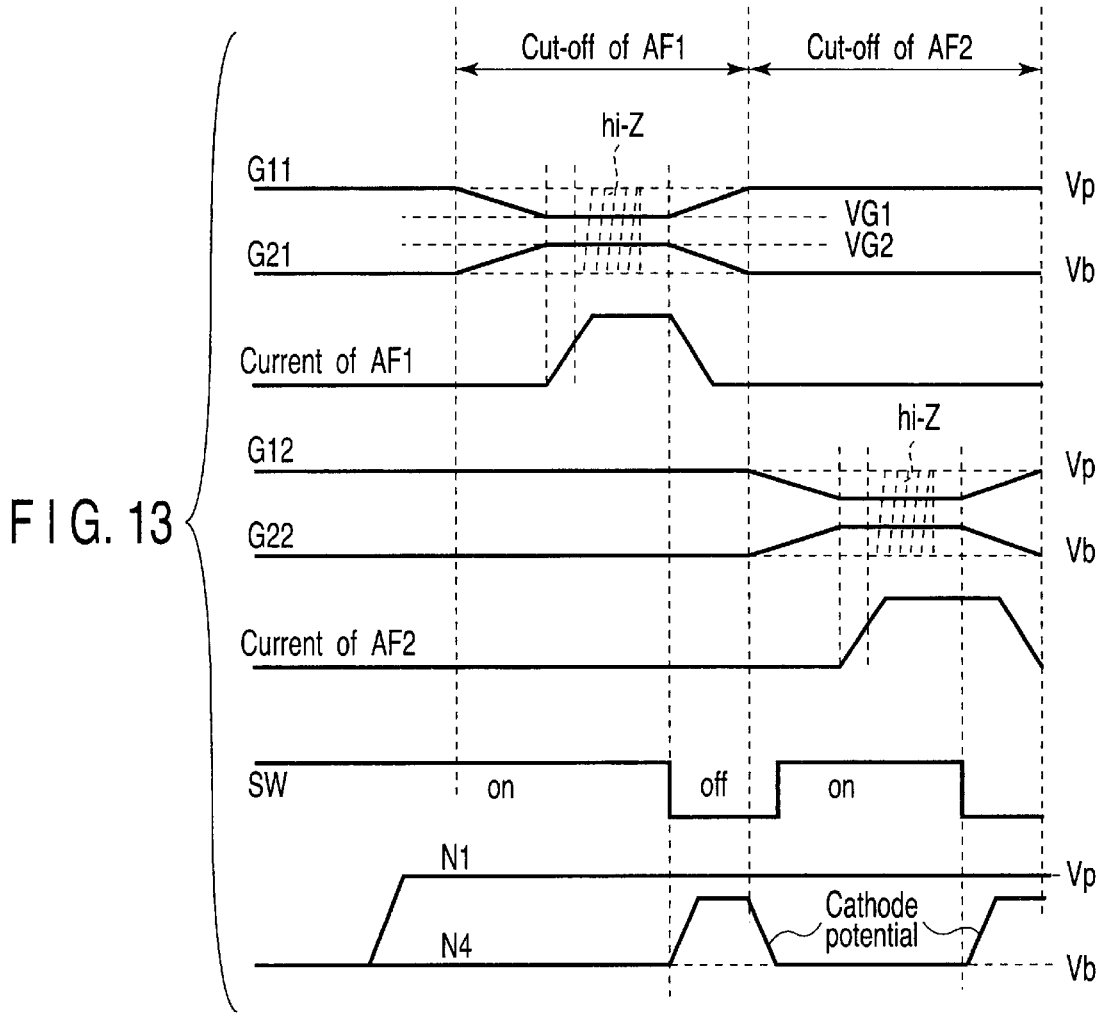
FIG. 13 is a timing chart showing the operation of the embodiment shown in FIG. 12.

FIG. 13 is a timing chart showing the operation of a circuit of FIG. 12. In FIG. 13, the thyristor is so turned ON as in the case of FIGS. 9 and 11. At this time, the switch SW is turned ON. For this reason, for example, the thyristor SR1 is turned ON and, when the output end of the decoder 11 is put in a high impedance state, an antifuse AF1 is programmed. After this, the switch SW is turned OFF at a fully programmed timing of the antifuse AF1. For this reason, a power supply to the thyristor SR1 is blocked, thus turning the thyristor SR1 OFF. At this time, a potential on the cathode terminal C of the thyristor SR1 varies but a potential Vp on the first node N1 only slightly varies.

According to the fourth embodiment, the switch SW is provided between the cathode terminals C of the thyristors SR1, SR2, . . . , SRn and the second power supply node N2 and, after the antifuses AF1, AF2, . . . , AFn, are programmed, the switch SW is turned OFF, thus turning the thyristor OFF. Therefore, the decoder 11 need not draw out a minority carrier of the thyristor from the gate and it is possible to positively turn the thyristor OFF without enlarging the size of the decoder 11. Since it is possible to suppress a potential variation on the first power supply node, the pump circuit operates in a stable fashion.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A fuse programming circuit comprising:
    a fuse having first and second ends and programmed in accordance with a current supplied, the first end being connected to a first power supply;
    a thyristor having first and second electrodes and a gate electrode, the first electrode being connected to the second end of the fuse and the second electrode being connected to a second power supply lower in potential than the first power supply; and
    a control circuit having an input terminal supplied with an input signal and an output terminal connected to the gate electrode of the thyristor, the control circuit generating a control signal in accordance with the input signal which is supplied to the gate electrode of the thyristor to turn the thyristor ON, wherein the control circuit has said output terminal put in a high impedance state after turning the thyristor ON.

2. A circuit according to claim 1, wherein the fuse is comprised of a fuse whose current path is cut off in accordance with a current supplied.

3. A circuit according to claim 1, wherein the fuse is comprised of an antifuse whose current path is short-circuited in accordance with a current supplied.

4. A circuit according to claim 1, wherein the thyristor includes:
    a substrate of a first conductivity type;
    a first well area of a second conductivity type formed in the substrate;
    a second well area of the first conductivity type formed in the first well area;
    a first gate area of the second conductivity type formed in the first well area;
    an anode area of the first conductivity type formed in the first well area;
    a second gate area of the first conductivity type formed in the second well area; and
    a cathode area of the second conductivity type formed in the second well area.

5. A circuit according to claim 1, wherein the control circuit includes:
    a decode section for decoding an address signal;
    a signal generation circuit having an input terminal connected to the decode section and first and second output terminals, the signal generation circuit generating a first signal in accordance with an output signal of the decode section and a second signal delayed behind the first signal by a predetermined time and outputting the first signal from said first output terminal and the second signal from said second output terminal; and
    a tri-state buffer having a first input terminal connected to said first output terminal of the signal generation circuit, a second input terminal connected to said second output terminal of the signal generation circuit, and a third output terminal connected to the gate electrode of the thyristor, the tri-state buffer outputting a potential for turning the thyristor ON from said third output terminal in accordance with said first signal supplied to said first input terminal and having said third output terminal put in a high impedance state in accordance with said second signal supplied to said second input terminal.

6. A circuit according to claim 1, wherein a potential of the control signal outputted from the control circuit is lower than a potential of the first power supply when the fuse is programmed.

7. A circuit according to claim 1, wherein the thyristor includes:
    a substrate of a first conductivity type;
    a first well area of a second conductivity type formed in the substrate;
    a second well area of the first conductivity type formed in the substrate, said second well area being formed in a region different from said first well area;
    a first gate area of the second conductivity type formed in the first well area;
    an anode area of the first conductivity type formed in the first well area;

a second gate area of the first conductivity type formed in the second well area; and a cathode area of the second conductivity type formed in the second well area.

8. A fuse programming circuit comprising:

a plurality of fuses having first and second ends and programmed in accordance with a current supplied, the first end of each of the fuses being connected to a first power supply;

a plurality of thyristors having first and second electrodes and first and second gate electrodes, the first electrode of the respective thyristor being connected to the second end of the corresponding fuse and the respective second electrode being connected to a second power supply lower in potential than the first power supply; and a control circuit having an input terminal supplied with an input signal and a plurality of output terminals connected to the first and second gate electrodes of the respective thyristors, the control circuit generating a control signal for selecting one of the thyristors in accordance with the input signal, wherein the control circuit has its respective output terminal put in a high impedance state after the respective thyristor is turned ON.

9. A circuit according to claim 8, wherein the control circuit includes:

a decode section for decoding an address signal;

a signal generation circuit having an input terminal connected to the decode section and first and second output terminals, the signal generation circuit generating a first signal in accordance with an output signal of the decode section and a second signal delayed behind the first signal by a predetermined time and outputting the first signal from said first output terminal and the second signal from said second output terminal; and a tri-state buffer having a first input terminal connected to said first output terminal of the signal generation circuit, a second input terminal connected to said second output terminal of the signal generation circuit, and a third output terminal connected to the first gate electrode of one thyristor, the tri-state buffer outputting a potential for turning the thyristor ON from said third output terminal in accordance with said first signal supplied to said first input terminal and having said third output terminal put in a high impedance state in accordance with said second signal supplied to said second input terminal.

10. A circuit according to claim 9, wherein each fuse is comprised of a fuse whose current path is cut off in accordance with a current supplied.

11. A circuit according to claim 9, wherein each fuse is comprised of an antifuse whose current path is short-circuited in accordance with a current supplied.

12. A circuit according to claim 8, wherein the input signal is an address signal and the control circuit is comprised of a decoding circuit for decoding the address signal.

13. A circuit according to claim 8, wherein the control circuit generates a first control signal and a second control signal, wherein the first and second control signals outputted from the control circuit at a time of programming the fuses are such that the first control signal supplied to the first gate electrode of the selected thyristor is set to be lower in potential than the first power supply and such that the second control signal supplied to the second gate electrode of the selected thyristor is set to be higher in potential than the second power supply.

14. A circuit according to claim 13, wherein each thyristor includes:

a substrate of a first conductivity type;

a first well area of a second conductivity type formed in the substrate;

a second well area of the first conductivity type formed in the substrate, said second well area being formed in a region different from said first well area;

a first gate area of the second conductivity type formed in the first well area;

an anode area of the first conductivity type formed in the first well area;

a second gate area of the first conductivity type formed in the second well area; and a cathode area of the second conductivity type formed in the second well area.

15. A circuit according to claim 13, wherein each thyristor includes:

a substrate of a first conductivity type;

a first well area of a second conductivity type formed in the substrate;

a second well area of the first conductivity type formed in the first well area;

a first gate area of the second conductivity type formed in the first well area;

an anode area of the first conductivity type formed in the first well area;

a second gate area of the first conductivity type formed in the second well area; and a cathode area of the second conductivity type formed in the second well area.

16. A fuse programming circuit comprising:

a plurality of antifuses having first and second ends and programmed by short-circuiting their current paths, the first end of the respective antifuse being connected to a first power supply;

a plurality of thyristors, each, connected to the second end of the corresponding antifuse, the respective thyristor supplying a voltage to the antifuse to allow the antifuse to be programmed; and a decoder for selecting one of these thyristors in accordance with an address signal and turning that thyristor ON, an output terminal of said decoder being set in a high impedance state after turning said thyristor ON.

17. A circuit according to claim 16, wherein, after turning the thyristor ON, the decoder eliminates a minority carrier from a gate of the thyristor to turn the thyristor OFF.

18. A circuit according to claim 16, further comprising a switch connected between the first ends of the respective antifuses and the first power supply, the switch being turned ON when the selected antifuse is programmed and turned OFF after the antifuse has been programmed.

19. A circuit according to claim 16, further comprising a switch connected between electrodes of the respective thyristors and a second power supply, the switch being turned ON when the selected antifuse is programmed and turned OFF after the antifuse has been programmed.

20. A circuit according to claim 16, wherein each thyristor has first and second gate electrodes, and wherein control signals outputted from the control circuit at a time of programming the antifuses are such that a first control signal supplied to the first gate electrode of the selected thyristor is set to be lower in potential than the first power supply and such that a second control signal supplied to the second gate electrode of the selected thyristor is set to be higher in potential than a second power supply connected to the selected thyristor.

21. A circuit according to claim 20, wherein the thyristor includes:

a substrate of a first conductivity type;

a first well area of a second conductivity type formed in the substrate;

a second well area of the first conductivity type formed in the substrate, said second well area being formed in a region different from said first well area;

a first gate area of the second conductivity type formed in the first well area;

an anode area of the first conductivity type formed in the first well area;

a second gate area of the first conductivity type formed in the second well area; and a cathode area of the second conductivity type formed in the second well area.

22. A circuit according to claim 20, wherein the thyristor includes:

a substrate of a first conductivity type;

a first well area of a second conductivity type formed in the substrate;

a second well area of the first conductivity type formed in the first well area;

a first gate area of the second conductivity type formed in the first well area;

an anode area of the first conductivity type formed in the first well area;

a second gate area of the first conductivity type formed in the second well area; and a cathode area of the second conductivity type formed in the second well area.

23. A fuse programming circuit comprising:

a fuse programmed by being supplied with a current;

a thyristor having a current path and a gate electrode, one end of the current path of the thyristor being connected to the fuse; and a control circuit connected to the gate electrode of the thyristor, wherein the control circuit sets the gate electrode in a high impedance state after turning the thyristor ON and programming the fuse.

* * * * *

UNITED STATES PATENT AND TRADEMARK OFFICE
CERTIFICATE OF CORRECTION

PATENT NO.    : 6,438,059 B2
DATED         : August 20, 2002
INVENTOR(S)   : Hironobu Akita et al.

It is certified that error appears in the above-identified patent and that said Letters Patent is hereby corrected as shown below:

<u>Column 11,</u>
Lines 49 and 52, "claim 9" has been replaced with -- claim 8 --.

Signed and Sealed this

Fifteenth Day of April, 2003

JAMES E. ROGAN
*Director of the United States Patent and Trademark Office*